United States Patent
Foster, Sr.

(10) Patent No.: US 6,555,760 B2
(45) Date of Patent: Apr. 29, 2003

(54) ELECTRONIC CIRCUIT INTERCONNECTION SYSTEM USING A VIRTUAL MIRROR CROSS OVER PACKAGE

(75) Inventor: Jimmy Grant Foster, Sr., Morrisville, NC (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/122,581

(22) Filed: Apr. 15, 2002

(65) Prior Publication Data

US 2002/0108775 A1 Aug. 15, 2002

Related U.S. Application Data

(60) Division of application No. 09/280,025, filed on Mar. 26, 1999, now Pat. No. 6,418,490, which is a continuation-in-part of application No. 09/223,135, filed on Dec. 30, 1998.

(51) Int. Cl.[7] .................................................. H05K 1/11
(52) U.S. Cl. ...................... 174/261; 174/254; 710/100; 361/777; 361/779; 257/691
(58) Field of Search ................................ 174/261, 250, 174/254; 710/100; 361/777, 779, 803; 257/691, 786; 365/51, 63

(56) References Cited

U.S. PATENT DOCUMENTS

| | | | |
|---|---|---|---|
| 3,611,317 A | * 10/1971 | Bonfeld | 257/691 |
| 3,774,168 A | * 11/1973 | Koo et al. | 365/237 |
| 4,578,697 A | * 3/1986 | Takemae | 257/703 |
| 4,604,678 A | * 8/1986 | Hagner | 361/761 |
| 4,858,072 A | * 8/1989 | Chall, Jr. | 361/708 |
| 5,287,304 A | * 2/1994 | Harward et al. | 365/189.01 |
| 5,953,216 A | * 9/1999 | Farnworth et al. | 361/777 |
| 6,075,711 A | * 6/2000 | Brown et al. | 361/761 |

* cited by examiner

Primary Examiner—David L. Talbott
Assistant Examiner—José H Alcala
(74) Attorney, Agent, or Firm—Martin J. McKinley

(57) ABSTRACT

A virtual mirror "crossover" package includes two groups of electrically interconnected pairs of first and second connection points. Within each group, the set of first and second connection points are positioned adjacent opposing edges of a chip carrier or other package, such that one group of connection point pairs can be connected to a first bus running in an "X" direction on a substrate, while the other group of connection point pairs can be connected to a second bus running in a "Y" direction perpendicular to the "X" direction. The virtual mirror crossover package can be used in an array of packages in which the packages in each column are connected to a unique system bus, and a row of packages containing a virtual mirror crossover package is also connected to an inter-system bus (such as a cluster bus) for providing communication between the various system buses via the inter-system bus. The close proximity of the packages significantly reduces the signal propagation delay time and permits higher speed operation of the system buses, as well as inter-system bus.

8 Claims, 5 Drawing Sheets

ELECTRONIC CIRCUIT INTERCONNECTION SYSTEM USING A VIRTUAL MIRROR CROSS OVER PACKAGE

CROSS REFERENCE TO OTHER APPLICATIONS

This is a divisional application of application Ser. No. 09/280,025 filed Mar. 26, 1999, U.S. Pat. No. 6,418,980, which is a continuation-in-part of co-pending application Ser. No. 09/223,135 filed Dec. 30, 1998. These co-pending applications are incorporated herein by reference.

BACKGROUND OF THE INVENTION

This invention pertains to packages (e.g., chip carriers) that contain integrated circuits or other electronic circuits and, more particularly, to such a package wherein the electrical interconnections (e.g., pins or solder pads) are arranged in a virtual mirror cross over pattern. This invention also pertains to an array of packages in which the packages in each column are connected to a unique system bus, and a row of packages containing a virtual mirror cross over package are also connected to an inter-system bus (such as a cluster bus) for providing communication between the various system buses via the inter-system bus.

It is well known that the propagation delay between two points (i.e., the time it takes an electrical signal to travel between the two points) increases as the distance between the two points increases. Consequently, one factor that limits the speed of a bus in a computer or other information processing system is the distance between the various components that are coupled to the bus. More specifically, the bus master and slave devices that have the greatest physical separation on the bus is one factor that limits the maximum speed of the bus. Stated another way, for any given bus speed, the maximum physical separation between any bus master and slave device must be less than a predetermined distance, and that predetermined distance gets shorter and shorter as bus speed increases. While the spacing of bus components is not problematic at bus clock frequencies well below 100 MHZ, component spacing becomes critical at higher clock frequencies where it becomes imperative to keep component spacing to a minimum.

FIGS. 1 and 2 are plan views of prior art computer component interconnection systems wherein five interconnected "nodes" are illustrated. Referring to these figures, components 101, 102, 103 and 104 may be four processors and component 105 may be a memory/host bridge controller. These components are interconnected by bus 106 (FIG. 1) or bus 201 (FIG. 2). Components 101–104 typically extend several inches in the "z" direction (out of the paper) and are separated by about two inches to accommodate large heat sinks. Consequently, the large separation of components in the "x" direction, which is required for the heat sinks, and the extension of the components in the "z" direction results in a long "signaling distance" between components, which significantly limits the maximum speed of operation.

One technique for placing bus components close together is to use mirror image components placed on opposite sides of a thin substrate, such as a printed circuit board. Since mirror image components are only separated by the thickness of the substrate when interconnected in this manner, this technique brings the components very close together. The downside to the use of "true mirror image" components is that they require the manufacturer to stock and test two separate part numbers; one for the standard component and another for its mirror image.

Accordingly, the invention described below allows multiple electronic components to be interconnected very close together, thereby reducing the propagation delay between components and permitting higher speed operation. This invention also permits identical components (for example, multiple CPU's) in identical "virtual mirror" packages to be interconnected on opposite sides of a substrate, thereby eliminating the need for two separate "true mirror image" packages. The invention described below also permits large heat sinks to be attached to the components for improved cooling. This invention also permits multiple bus systems, such a "clustered" computer system, to be closely spaced together in an array for high speed operation not only on the individual system buses, but also on the intersystem bus.

SUMMARY OF THE INVENTION

Briefly, the invention is an information handling system including a substrate having first and second sides, wherein the first side of the substrate includes first and second system buses extending in a "Y" direction, and an inter-system bus extending in an "X" direction substantially perpendicular to the "Y" direction. A first chip carrier has a multiplicity of pairs of system connection points, wherein each pair of system connection points includes electrically interconnected first and second system connection points. The set of first system connection points is arranged in a first pattern adjacent a first edge of the first chip carrier, and the set of second system connection points is arranged in a second pattern adjacent a second edge of the first chip carrier, such that the second pattern is the virtual mirror of the first pattern. The set of first system connection points is coupled to the first system bus. The first chip carrier also has a multiplicity of pairs of intersystem connection points, wherein each pair of inter-system connection points includes electrically interconnected first and second inter-system connection points. The set of first inter-system connection points is arranged in a third pattern adjacent a third edge of the first chip carrier, and the set of second inter-system connection points is arranged in a fourth pattern adjacent a fourth edge of the first chip carrier. The set of first inter-system connection points is coupled to the intersystem bus. A second chip carrier has a multiplicity of system connection points adjacent a first edge of the second chip carrier and is coupled to the second system bus. The second chip carrier has a multiplicity of inter-system connection points adjacent a second edge of the second chip carrier, which are coupled to the inter-system bus. A third chip carrier has a multiplicity of system connection points adjacent a first edge of the third chip carrier, which are coupled to the first system bus adjacent the first edge of the first chip carrier. A fourth chip carrier has a multiplicity of system connection points adjacent a first edge of the fourth chip carrier, which are coupled to the second system bus adjacent the first edge of the second chip carrier. The third chip carrier processes information on the first system bus, the fourth chip carrier processes information on the second system bus, and the first and second chip carriers communicate information between the first system bus and the second system bus.

In another embodiment, the invention is a virtual mirror cross over chip carrier that includes a first multiplicity of pairs of connection points, wherein each pair of connection points of the first multiplicity of connection point pairs includes electrically interconnected first and second connection points. The set of first connection points is arranged in a first pattern along a first edge of the chip carrier, and the set of second connection points is arranged in a second pattern along a second edge of the chip carrier, such that the second pattern is the virtual mirror of the first pattern. A second multiplicity of pairs of connection points is included, wherein each pair of connection points of the second multiplicity of connection point pairs includes electrically interconnected third and fourth connection points. The set of third connection points is arranged in a third pattern along a third edge of the chip carrier, and the set of fourth connection points is arranged in a fourth pattern along a second edge of the chip carrier.

DESCRIPTION OF THE ILLUSTRATIVE EMBODIMENTS

Figure 3:
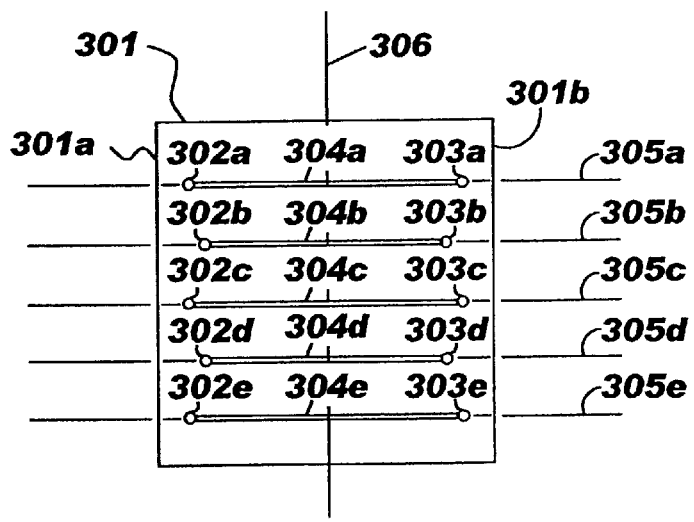
FIG. 3 is a plan view of a virtual mirror chip carrier package of the current invention.

FIG. 3 is a plan view of a chip carrier having connection points arranged in a virtual mirror pattern. Referring to this figure, chip carrier 301 includes five pairs of first and second connection points arranged in two sets; the first set of connection points 302 (consisting of individual points 302*a*–302*e*) being arranged adjacent edge 301*a*, and the second set of connection points 303 (consisting of individual points 303*a*–303*e*) being arranged adjacent edge 301*b*, which is directly opposite edge 301*a*. Conductors 304*a*–304*e* in chip carrier 301 electrically connect each connection point of the first set of connection points 302 to a corresponding connection point from the second set of connection points 303, thereby forming five pairs of connection points. For example, connection points 302*a* and 303*a* form one pair of connection points, connection points 302*b* and 303*b* form another pair of connection points, etc. Preferably, chip carrier 301 is constructed as a well known ball grid array package, although other integrated circuit or electronic circuit packaging may be suitable.

Figure 4:
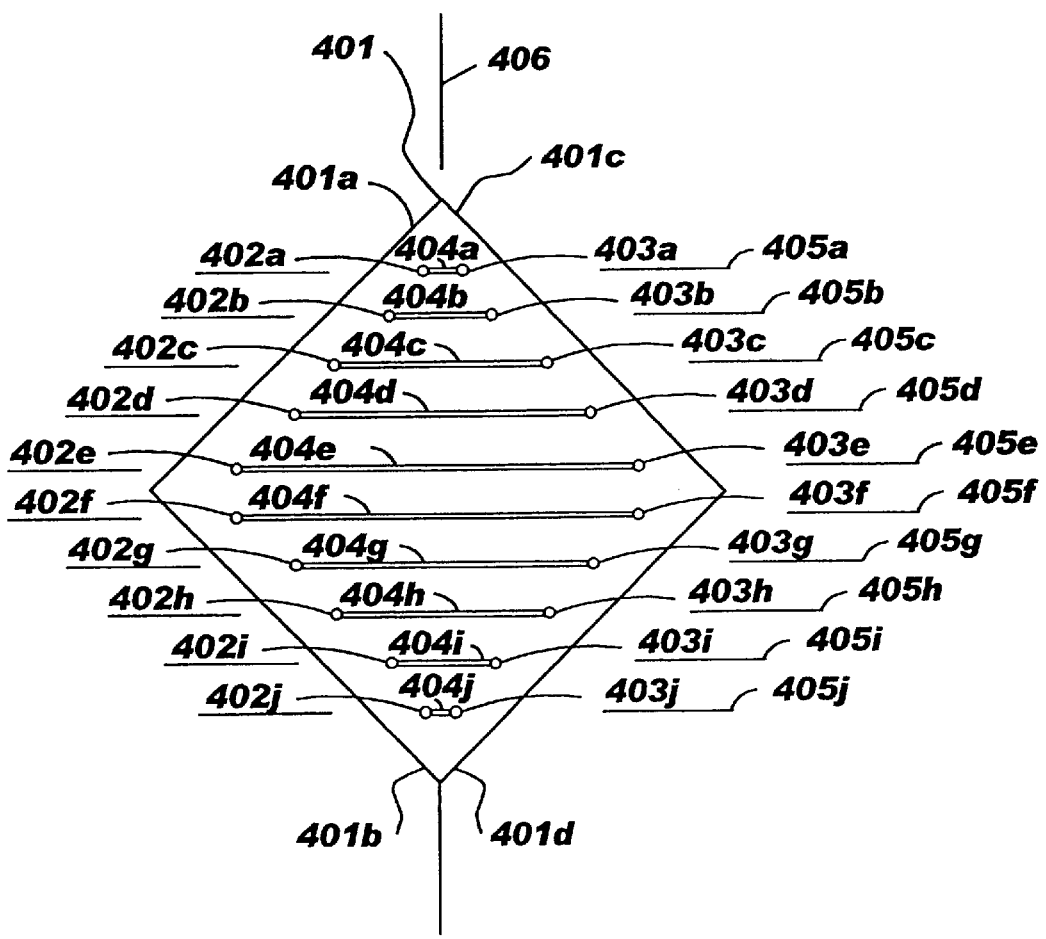
FIG. 4 is a plan view of another virtual mirror chip carrier package.

FIG. 4 is a plan view of chip carrier having connection points arranged in a another virtual mirror pattern. Referring to this figure, chip carrier 401 includes ten pairs of first and second connection points arranged in two sets; the first set of connection points 402 (consisting of individual points 402*a*–402*j*) being arranged adjacent edges 401*a* and 401*b*, and the second set of connection points 403 (consisting of individual points 403*a*–403*j*) being arranged adjacent edges 401*c* and 401*d*. Conductors 404*a*–404*j* of chip carrier 401 electrically connect each connection point of the first set of connection points 402 to a corresponding connection point from the second set of connection points 403, thereby forming ten pairs of connection points. For example, connection points 402*a* and 403*a* form one pair of connection points, connection points 402*b* and 403*b* form another pair of connection points, etc. Preferably, chip carrier 401 is constructed as a well known ball grid array package, although other integrated circuit or electronic circuit packaging may be suitable.

As it is used to describe an arrangement of pairs of first and second connection points, the term "virtual mirror pattern" means that, if straight lines are drawn to connect the first and second connection points of each pair of connection points, then those straight lines would all be substantially parallel. This concept is illustrated in FIG. 3 wherein imaginary lines 305*a*–305*e* are all parallel, and again in FIG. 4 wherein imaginary lines 405*a*–405*j* are all parallel. If these lines are substantially parallel, it can also be said that the arrangement of the set of second connection points is the virtual mirror of the set of first connection points. If two chip carriers have the same virtual mirror pattern of pairs of connection points, then their respective pairs of connection points are co-linear when the two chip carriers are placed side-by-side.

Figure 5:
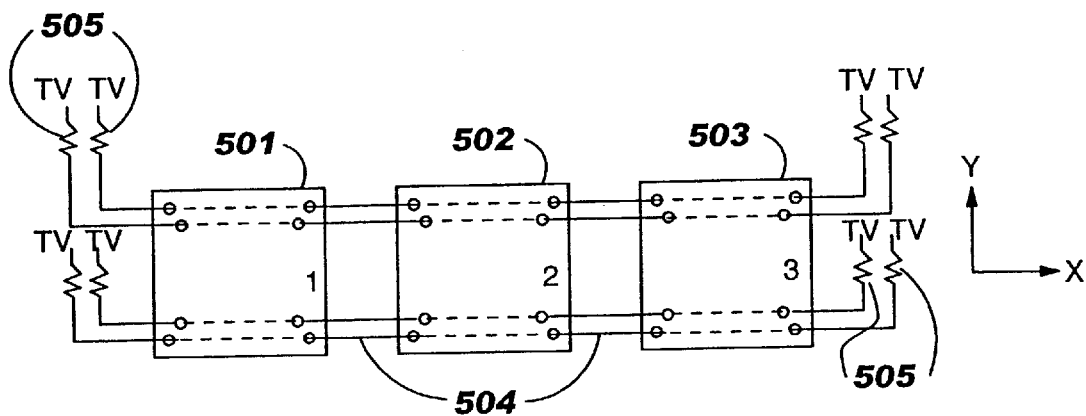
FIG. 5 is a plan view of a component interconnection system using virtual mirror packages on one side of a substrate.

This parallel arrangement of the pairs of connection points permits a first set of chip carriers, each having the same virtual mirror pattern of connection points, to be mounted in a straight line, edge-to-edge, and connected to a bus composed of a plurality of parallel conductors formed on a first surface of a substrate. This concept is illustrated in FIG. 5 wherein three virtual mirror chip carrier packages 501–503 are connected, edge-to-edge, to a bus 504 composed of a multiplicity of parallel conductors formed on the surface of a substrate. Note that the spacing between chip carriers 501–503 can be arbitrarily small.

Figure 6:
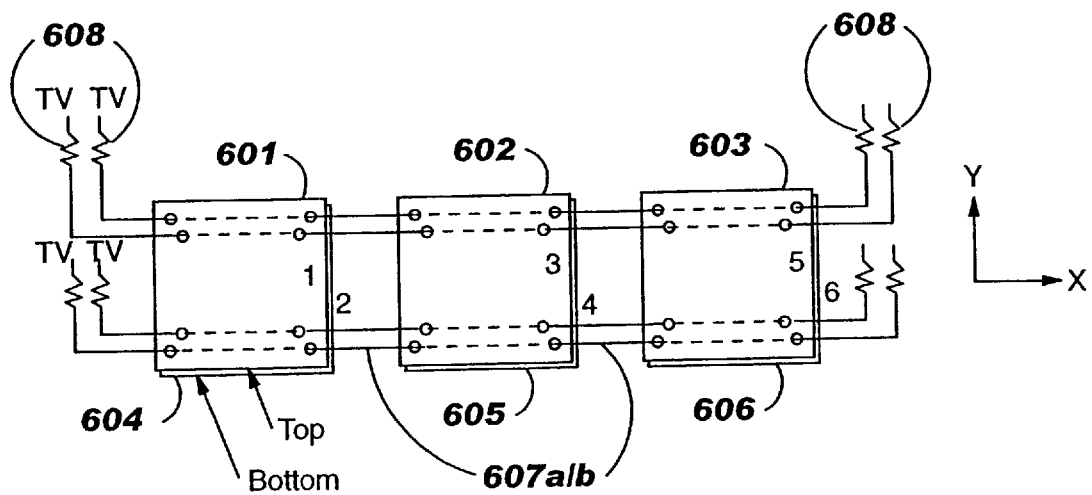
FIG. 6 is a plan view of a component interconnection system using virtual mirror packages on two sides of a substrate.

A similar bus of parallel conductors can also be formed on the opposing second surface of the substrate, directly below the corresponding conductors of the bus on the first surface. In the alternative, this second bus does not require the parallel conductors of the first bus. Instead, the conductors of the second bus may simply be comprised of the exposed ends of the vias that connect the first bus on the first surface to the opposing second surface of the substrate. A second set of chip carriers having substantially the same virtual mirror pattern as the first set of chip carriers can then be attached to the bus on the second surface, directly below the chip carriers on the first surface. This concept is illustrated in FIG. 6, wherein three virtual mirror chip carrier packages 601–603 are connected (edge-to-edge, with minimal spacing between the three chip carriers) to a bus 607*a* composed of a multiplicity of parallel conductors formed on the first surface of a substrate, and three more virtual mirror chip carrier packages 604–606 are connected to bus 607*b* directly underneath chip carriers 601–603. Preferably, the conductors of bus 607*b* on the second surface of the substrate are directly underneath the corresponding conductors of bus 607*a* on the first side of the substrate, and are interconnected using well known vias.

To attach the second set of chip carriers to the second surface of the substrate, each of the chip carriers of the second set of chip carriers is inverted (relative to the first set of chip carriers) by rotating it 180° about an imaginary axis drawn perpendicular to the aforementioned parallel lines through each pair of connection points. When the chip carriers are inverted in this fashion, each pair of connection points can be lined up with the corresponding conductors of the bus on the second surface of the substrate which, in turn, are lined up directly underneath the corresponding conductors of the bus on the first surface of the substrate. Imaginary axes 306 and 406 are illustrated in FIGS. 3 and 4 and chip carriers 301 and 401 can be rotated 180° about these axes to orient the virtual mirror chip carriers for attachment to the underside of the substrate. This over/under arrangement of two sets of virtual mirror chip carriers allows for simple interconnection between the conductors of the buses on the first and second sides of the substrate. This interconnection between the conductors on the two surfaces of the substrate can be accomplished by using well known "vias" or other surface-to-surface interconnection techniques.

It is preferred, but not required, that the sets of first and second connection points be symmetrical about an imaginary axis. If such symmetry exists, then this imaginary axis is the line that perpendicularly bisects the parallel line segments that can be drawn through each pair of connection points. This concept is illustrated in FIG. 3 wherein imaginary axis 306 perpendicularly bisect the line segments drawn between each pair of connection points (e.g., 302a and 303a, 302b and 303b, etc.). These line segments coincide with lines 305a–305e, but terminate at the connection points. This concept is also illustrated in FIG. 4 wherein imaginary axis 406 perpendicularly bisects the line segments drawn between each pair of connection points (e.g., 402a and 403a, 402b and 403b, etc.) Given two chip carriers having pairs of connection points arranged in the same symmetrical virtual mirror pattern, if the second chip carrier is rotated 180° about its imaginary axis and then placed directly underneath the first chip carrier, then each and every one of the pairs of connection points of the first chip carrier will be positioned directly above the corresponding pair of connection points of the second chip carrier.

It is preferred, but not required, that the parallel lines be equally spaced. When the connection points are equi-spaced, the conductors on the substrate to which the chip carrier is attached can also be equi-spaced. The chip carriers illustrated in FIGS. 3 and 4 are examples of equi-spaced, symmetrical virtual mirror patterns.

Note that the term "chip carrier" is used in a broad sense throughout the specification and claims and includes any type of package that can be used to house an integrated circuit chip or other electrical circuit device. The term "substrate" includes printed circuit boards, ceramic substrates (such as those used in thick and thin film hybrid circuits) and other materials and techniques to which electrical components are attached and interconnected. The term "connection point" includes well know pins (such as the type that are inserted into a socket), solder pads and other connection devices that serve to electrically interconnect the chip carrier to conductors on a substrate.

Figure 1:
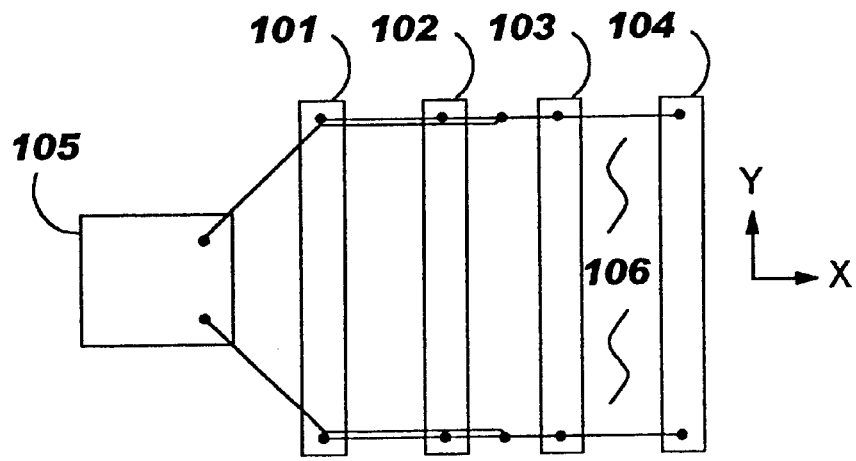
FIG. 1 is a plan view of a prior art computer component interconnection system.
Figure 2:
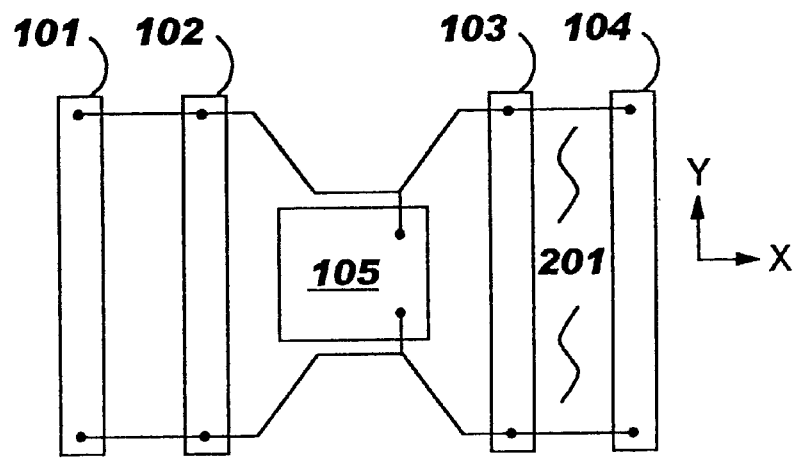
FIG. 2 is a plan view of another prior art computer component interconnection system.

One advantage to the systems described herein is that, because the components are so close together, they can now share pull up resistors (e.g., resistors 505 and 608) or decoupling capacitors (not illustrated). In fact, it is likely that a savings of 75 % in the number of decoupling capacitors will be realized by the use of the virtual mirror system of FIG. 6 when compared to the prior art systems of FIGS. 1 and 2. This could result in a 100 component reduction in the total number of pull up resistors and decoupling capacitors, when compared to the prior art systems.

Another advantage to the systems of FIGS. 5 and 6 is that they are well suited for thermal cooling, since a heat sink or heat pipe can be placed flat across each individual component, or across all components on one surface of the substrate.

The primary advantage of the systems of FIGS. 5 and 6 is that a significant increase in bus speed can be achieved simply because the components are closer together.

Figure 7:
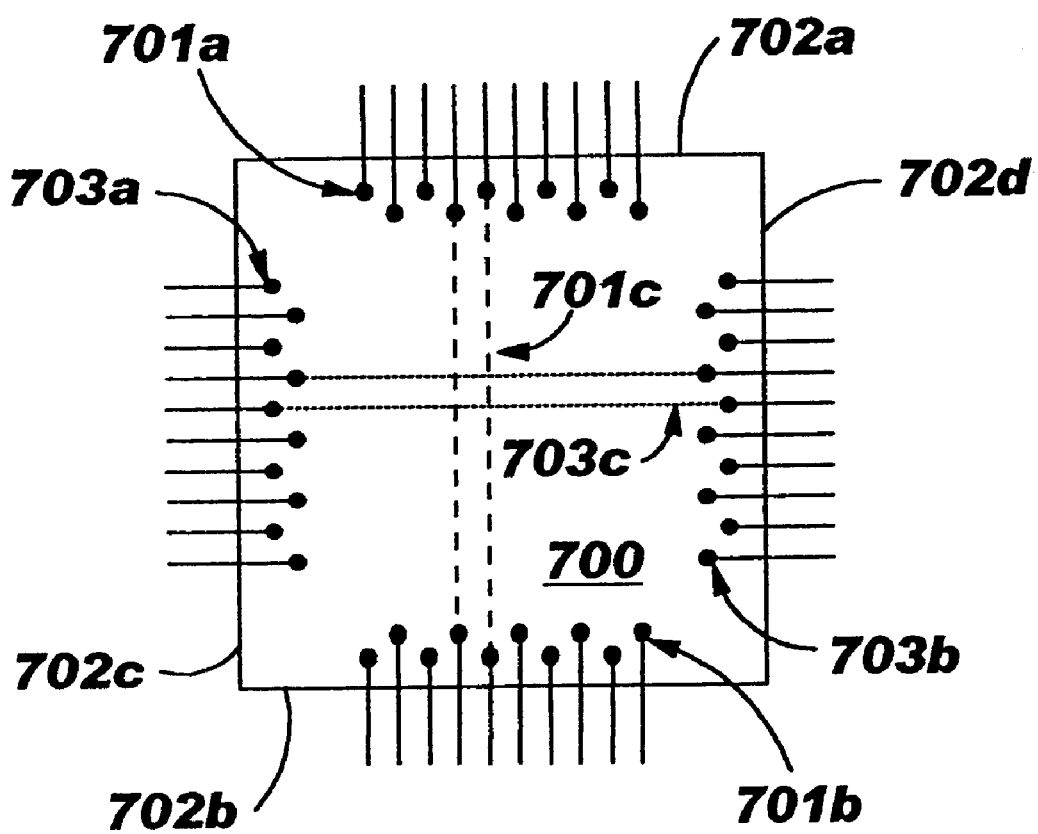
FIG. 7 is a plan view of a chip carrier package including two groups of electrically interconnected pairs of connections points arranged in a virtual mirror crossover pattern.

FIG. 7 is a plan view of a virtual mirror crossover package. Referring to this figure, a virtual mirror crossover package (VMCOP) 700 includes a first group of electrically interconnected pairs of first and second connection points 701a and 701b, with the set of first connection points 701a (10 are illustrated in FIG. 7) being positioned adjacent a first edge 702a of chip carrier 700. The set of second connection points 701b (10 are illustrated in FIG. 7) are positioned adjacent edge 702b, which is opposite edge 702a, and each one of the connection points 701b is interconnected (preferably, internally within chip carrier 700) to the corresponding connection point 701a via a runner 701c. In the first group of pairs of connection points, the first and second sets on connection points 701a and 701b are arranged in a virtual mirror pattern.

Similarly, package 700 also includes a second group of electrically interconnected pairs of first and second connection points 703a and 703b, with the set of first connection points 703a (10 are illustrated in FIG. 7) being positioned adjacent a third edge 702c of chip carrier 700. The set of second connection points 703b (10 are illustrated in FIG. 7) are positioned adjacent edge 702d, which is opposite edge 702c, and each one of the connection points 703b is interconnected (preferably, internally within chip carrier 700) to the corresponding connection point 703a via a runner 703c.

Figure 8:
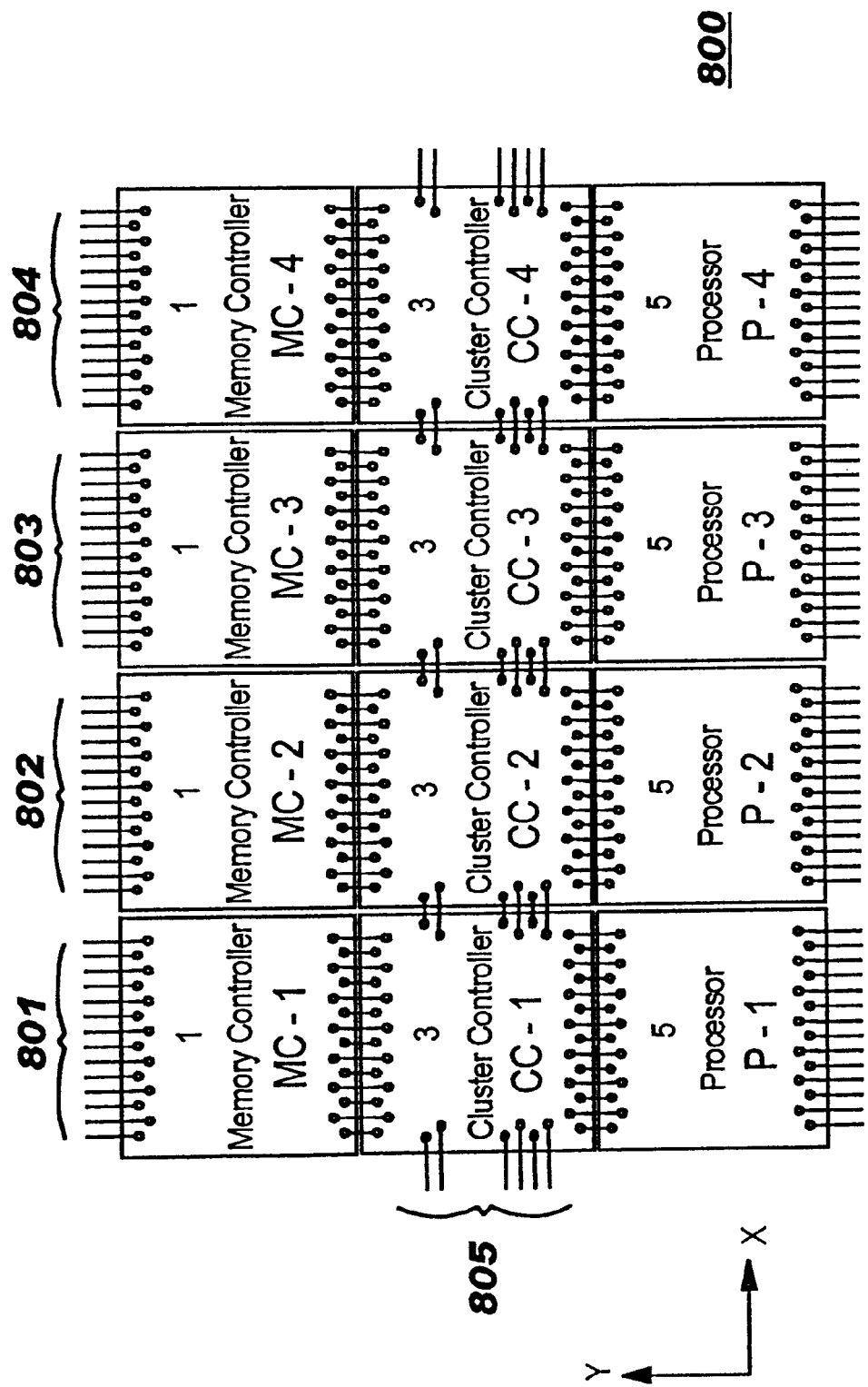
FIG. 8 is a plan view of a system, such a clustering system, having multiple system buses arranged in columns and an in inter-system or cluster bus arranged along one of the rows of the array of packages and employing a virtual mirror crossover package.

FIG. 8 is a plan view of a computer or other information processing system that includes a plurality of system buses 801–804 oriented parallel to a "Y" axis of a printed circuit board or other substrate, and a cluster bus or inter-system bus 805 oriented parallel to an "X" axis of the substrate. This particular invention will be described with reference to a clustered computer system, but it should be understood that it is applicable to any information handling system in which a plurality of system buses are interconnected through appropriate hardware and an inter-system bus.

Referring to FIG. 8, four well known memory controller chips in chip carriers MC-1 through MC-4 and four well known processor chips in chip carriers P-1 through P-4 are coupled, respectively, to system buses 801–804. Memory controllers chip carriers MC-1 through MC-4 and processor chip carriers P-1 through P-4 may be virtual mirror packages. Similarly, four well known cluster controller chips in virtual mirror crossover carriers CC-1 through CC-4 have one set of connection points (either the set adjacent the memory controllers, the set adjacent the processors, or both) coupled, respectively, to system buses 801–804. Another set of connection points (one or both of the sets oriented parallel to the "Y" axis) are coupled to cluster bus 805.

While only one side of the printed circuit board or other substrate is illustrated in FIG. 8, it should be understood that it is preferred that system buses 801–804 be duplicated on the opposing side of the substrate and interconnected to buses 801–804 using well known "vias" or other surface-to-surface interconnecting devices. On the reverse side of the substrate, additional chip carriers can be attached to the duplicates of buses 801–804. For example, in a preferred embodiment, 12 processors are attached to the reverse side of the substrate; four directly underneath memory controllers MC-1 through MC-4; four directly underneath cluster controllers CC-1 through CC-4; and four directly underneath processors P-1 through P-4. With 12 additional processors attached to the reverse side of the substrate, a clustered system results that has four processors per system bus

801–804, and four system buses "clustered" together via cluster bus 805. Note that cluster bus 805 does not have to be duplicated on the reverse side of the substrate.

In this example, the array is a 3×4×2 array having 3 rows, 4 columns (4 system buses) and 2 sides. In this arrangement and in any arrangement wherein the same type of chip, such as the processor chip in the example above, is placed on both side of the substrate, it is preferred that the chip carriers (excluding the cluster controller chip carriers, which are of the virtual mirror crossover design) be of the virtual mirror design so that the same part can be mounted on either side of the substrate. While a 3×4×2 exemplary embodiment of the invention has been described, it should be understood that the invention may be practiced in other array sizes, from as small as 2×2×1 and 2×2×2, up to any larger array sizes.

I claim as my invention:

1. A virtual mirror cross over chip carrier, comprising:

a first multiplicity of pairs of connection points, each pair of connection points of the first multiplicity of connection points pairs comprising electrically interconnected first and second connection points, the set of first connection points being arranged in a first pattern along a first edge of the chip carrier, and the set of second connection points being arranged in a second pattern along a second edge of the chip carrier, such that the second pattern is the virtual mirror of the first pattern; and a second multiplicity of pairs of connection points, each pair of connection points of the second multiplicity of connection point pairs comprising electrically interconnected third and fourth connection points, the set of third connection points being arranged in a third pattern along a third edge of the chip carrier, and the set of fourth connection points being arranged in a fourth pattern along a second edge of the chip carrier.

2. The virtual mirror cross over package of claim 1, wherein the third pattern is the virtual mirror of the fourth pattern.

3. The virtual mirror cross over package of claim 2, wherein:

the first and second sets of connection points are symmetrical about an imaginary axis that perpendicularly bisects each of the imaginary lines that connect the first and second connection points of each pair of connection points of the first multiplicity of connection point pairs; and the third and fourth sets of connection points are symmetrical about an imaginary axis that perpendicularly bisects each of the imaginary lines that connect the third and fourth connection points of each pair of connection points of the second multiplicity of connection point pairs.

4. The virtual mirror cross over chip carrier of claim 3, wherein:

each pair of connection points of the first multiplicity of connection point pairs is equally spaced apart from the adjacent pair of connection points; and each pair of connection points of the second multiplicity of connection point pairs is equally spaced apart from the adjacent pair of connection points.

5. The virtual mirror cross over chip carrier of claim 4, wherein the first edge of the chip carrier is substantially parallel to the second edge, and the third edge of the chip carrier is substantially parallel to the fourth edge.

6. The virtual mirror cross over chip carrier of claim 1, wherein the first and second sets of connection points are symmetrical about an imaginary axis that perpendicularly bisects each of the imaginary lines that connect the first and second connection points of each pair of connection points of the first multiplicity of connection point pairs.

7. The virtual mirror cross over chip carrier of claim 6, wherein each pair of connection points of the first multiplicity of connection point pairs is equally space apart from the adjacent pair of connection points.

8. The virtual mirror cross over chip carrier of claim 7, wherein the first edge of the chip carrier is substantially parallel to the second edge, and the third edge of the chip carrier is substantially parallel to the fourth edge.

* * * * *